United States Patent
Cha et al.

(10) Patent No.: US 6,284,590 B1
(45) Date of Patent: Sep. 4, 2001

(54) METHOD TO ELIMINATE TOP METAL CORNER SHAPING DURING BOTTOM METAL PATTERNING FOR MIM CAPACITORS

(75) Inventors: Randall Cher Liang Cha; Cheng Yeow Ng; Shao-Fu Sanford Chu; Tae Jong Lee; Chua Chee Tee, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/726,655

(22) Filed: Nov. 30, 2000

(51) Int. Cl.[7] ............................................ H01L 21/8242
(52) U.S. Cl. ........................... 438/240; 438/632; 438/957
(58) Field of Search .................................. 438/239, 240, 438/250, 253, 381, 393, 396, 595, 632, 646, 957

(56) References Cited

U.S. PATENT DOCUMENTS

| | | | | |
|---|---|---|---|---|
| 3,894,872 | * | 7/1975 | Mitchell, Jr. et al. | 438/381 |
| 5,622,893 | * | 4/1997 | Summerfelt et al. | 438/240 |
| 5,812,364 | | 9/1998 | Oku et al. | 361/312 |
| 5,918,135 | * | 6/1999 | Lee et al. | 438/250 |
| 5,998,264 | | 12/1999 | Wu | 438/260 |
| 6,037,206 | | 3/2000 | Huang et al. | 438/240 |
| 6,083,785 | | 7/2000 | Segawa et al. | 438/238 |
| 6,200,629 | * | 3/2001 | Sun | 438/523 |

FOREIGN PATENT DOCUMENTS

2000022083 * 1/2000 (JP).

* cited by examiner

Primary Examiner—Chandra Chaudhari
(74) Attorney, Agent, or Firm—George O. Saile; Rosemary L. S. Pike

(57) ABSTRACT

A method for fabricating a metal-insulator-metal capacitor wherein top metal corner shaping during patterning is eliminated is described. An insulating layer is provided overlying a semiconductor substrate. A first metal layer is deposited over the insulating layer. A capacitor dielectric layer is deposited overlying the first metal layer. A second metal layer is deposited overlying the capacitor dielectric layer and patterned to form a top metal electrode. A flowable material layer is deposited overlying the capacitor dielectric and the top metal electrode and anisotropically etched away to leave spacers on sidewalls of the top metal electrode. A photoresist mask is formed overlying the capacitor dielectric and the top metal electrode wherein the spacers provide extra photoresist thickness at the sidewalls of the top metal layer. The capacitor dielectric layer and the first metal layer are patterned wherein the patterned first metal layer forms a bottom metal electrode and wherein the spacers protect the top metal layer from etching during the patterning. The photoresist mask is removed, completing fabrication of a metal-insulator-metal capacitor.

27 Claims, 4 Drawing Sheets

METHOD TO ELIMINATE TOP METAL CORNER SHAPING DURING BOTTOM METAL PATTERNING FOR MIM CAPACITORS

BACKGROUND OF THE INVENTION (1) Field of the Invention

The present invention relates to a method of fabricating a metal-insulator-metal capacitor, and more particularly, to a method of forming a metal-insulator-metal capacitor without metal corner erosion in the fabrication of an integrated circuit device.

(2) Description of the Prior Art

Capacitors matching for metal-insulator-metal (MIM) capacitors in RF mixed signal applications is increasingly critical owing to stringent requirements. Nevertheless, process-instigated issues present major obstacles to efficient capacitor matching. One major process-instigated issue is varying capacitor characteristics owing to different extents of top metal erosion during bottom metal electrode patterning. Because of relatively poor etch selectivity between photoresist and metal, and because of thinner resist thickness lining the top metal electrode, especially along the sidewalls and top edges, the corners of the top metal electrode will be aggressively etched. This results in jagged edges at the top metal or corner rounding of the top metal electrode. The degree of etching or rounding differs from capacitor to capacitor and is uncontrollable. This makes capacitor matching for MIM in mixed signal applications difficult. It is desired to find a method to eliminate top metal corner shaping during bottom metal patterning of MIM capacitors.

U.S. Pat. No. 6,083,785 to Segawa et al shows a MIM capacitor process in which sidewall spacers are formed on a top polysilicon electrode over a resistor after patterning of the polysilicon structures. U.S. Pat. No. 5,998,264 to Wu, U.S. Pat. No. 6,037,206 to Huang et al, and U.S. Pat. No. 5,812,364 to Oku et al show various MIM capacitor processes.

SUMMARY OF THE INVENTION

Accordingly, it is a primary object of the invention to provide an effective and very manufacturable process for producing a metal-insulator-metal capacitor.

Another object of the present invention is to provide a method for fabricating a metal-insulator-metal capacitor wherein top metal corner shaping during patterning is eliminated.

Yet another object of the present invention is to provide a method for fabricating a metal-insulator-metal capacitor wherein top metal corner shaping during patterning is eliminated by the presence of sidewall spacers on the top metal electrode.

In accordance with the objects of this invention, a method for fabricating a metal-insulator-metal capacitor wherein top metal corner shaping during patterning is eliminated is achieved. An insulating layer is provided overlying a semiconductor substrate. A first metal layer is deposited over the insulating layer. A capacitor dielectric layer is deposited overlying the first metal layer. A second metal layer is deposited overlying the capacitor dielectric layer and patterned to form a top metal electrode. A flowable material layer is deposited overlying the capacitor dielectric and the top metal electrode and anisotropically etched away to leave spacers on sidewalls of the top metal electrode. A photoresist mask is formed overlying the capacitor dielectric and the top metal electrode wherein the spacers provide extra photoresist thickness at the sidewalls of the top metal layer. The capacitor dielectric layer and the first metal layer are patterned wherein the patterned first metal layer forms a bottom metal electrode and wherein the spacers protect the top metal layer from etching during the capacitor dielectric and bottom metal electrode patterning. The photoresist mask is removed, completing fabrication of a metal-insulator-metal capacitor.

BRIEF DESCRIPTION OF THE DRAWINGS

In the following drawings forming a material part of this description, there is shown.

DESCRIPTION OF THE PREFERRED EMBODIMENTS

Figure 1:
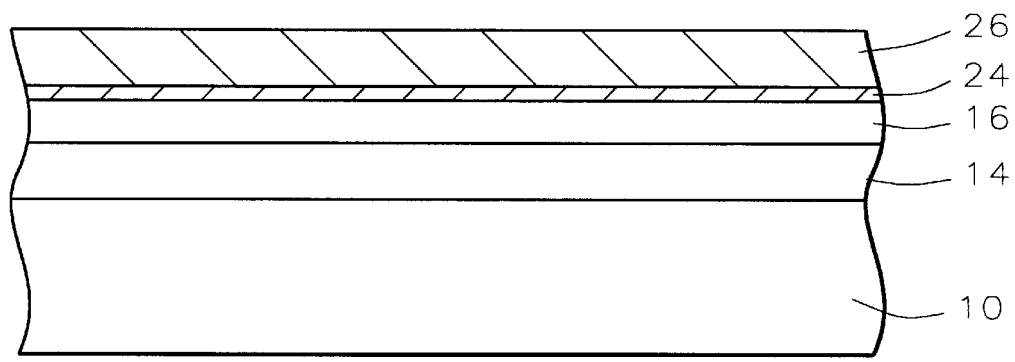
FIGS. 1 through 8 are schematic cross-sectional representations of a preferred embodiment of the present invention.

Referring now more particularly to FIG. 1, there is shown a partially completed integrated circuit device. The semiconductor substrate 10 is preferably composed of silicon having a (100) crystallographic orientation. Semiconductor device structures are formed in and on the semiconductor substrate. These may include gate electrodes and interconnection lines and associated source and drain regions. The semiconductor device structures, not shown, may be formed in layer 14 and covered with an insulating layer 16.

Connections are made to the underlying semiconductor device structures. For example, vias or contacts may be formed through the insulating layer 16 to contact devices within layer 14, not shown.

Now, the MIM capacitor of the present invention is to be formed. A barrier metal layer 24 is deposited over the insulating layer 16. This barrier metal layer may comprise silicon nitride, tantalum, tantalum nitride, tantalum and tantalum nitride, and so on, and have a thickness of between about 300 and 600 Angstroms. Now, a metal layer is formed over the barrier metal layer, such as by sputtering or electroplating. The metal layer 26 may comprise, for example, aluminum, aluminum-copper, copper, tungsten, alloys, and so on. Heavily doped polysilicon any also be considered. The metal layer 26 has a thickness of between about 3000 and 5000 Angstroms. The metal layer 26 will form the bottom plate electrode of the capacitor.

Figure 2:
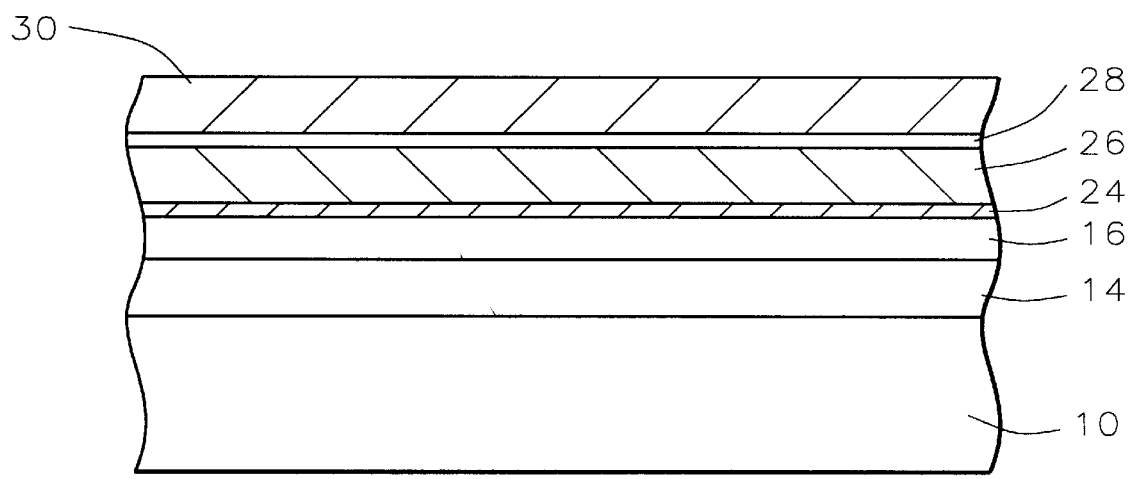

Referring now to FIG. 2, a capacitor dielectric layer 28 is deposited over the metal layer 26 to a thickness of between about 100 and 300 Angstroms. The capacitor dielectric layer may comprise silicon dioxide, TEOS oxide, silicon nitride, ONO, nitrided oxides, high dielectric constant dielectrics such as tantalum oxide, and so on.

A second metal layer 30 is deposited over the capacitor dielectric 28 to a thickness of between about 3000 and 5000 Angstroms. This metal layer also may comprise, for example, aluminum, aluminum-copper, copper, tungsten, alloys, and so on.

Figure 3:
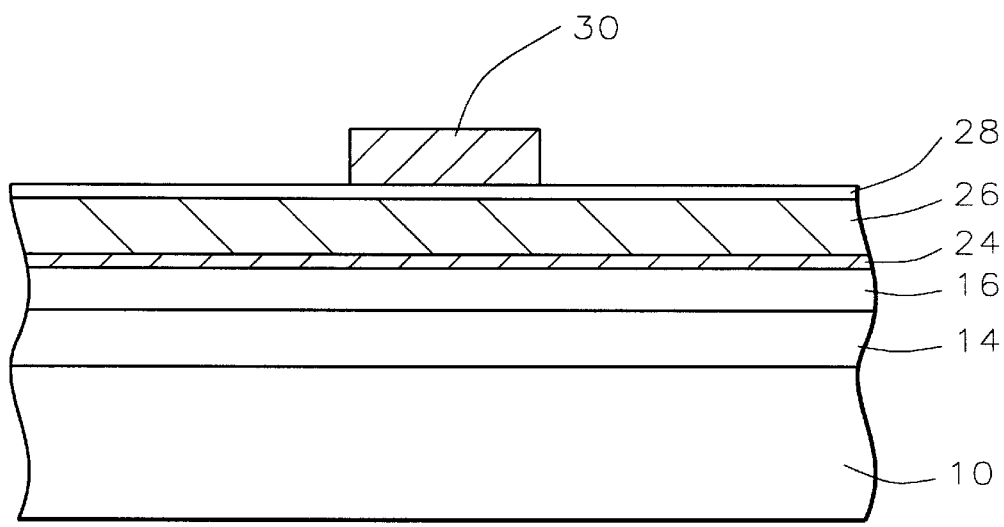

Referring now to FIG. 3, the top metal layer 30 is patterned to form the top metal electrode. Next, the capacitor dielectric and the bottom metal layer will be patterned to complete the MIM capacitor. The bottom metal electrode primarily is patterned to form interconnection patterns. Hence, patterning the bottom metal electrode last allows for more freedom in interconnection design and layout. The corners of the top metal electrode must be protected from etching or rounding during this patterning so as to attain consistent capacitor matching.

Figure 4:
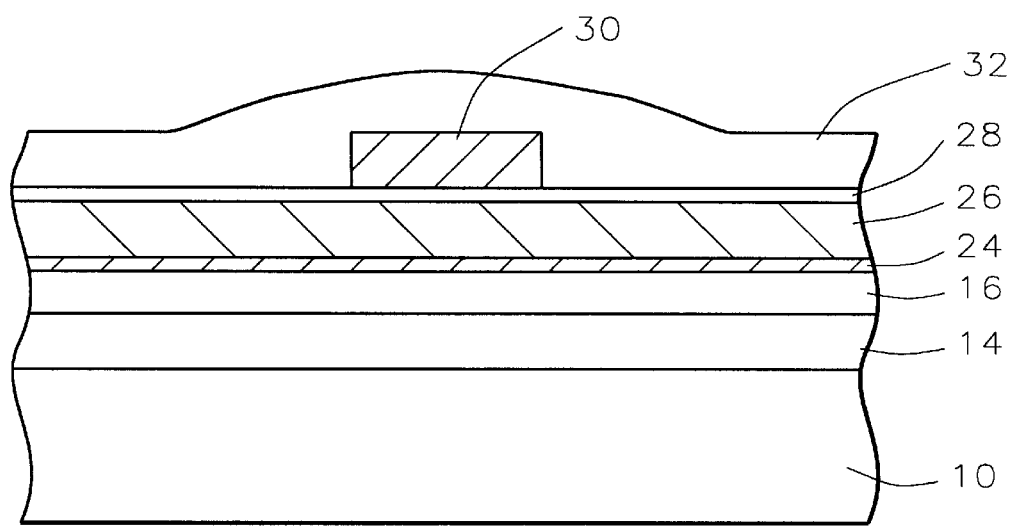
Figure 5:
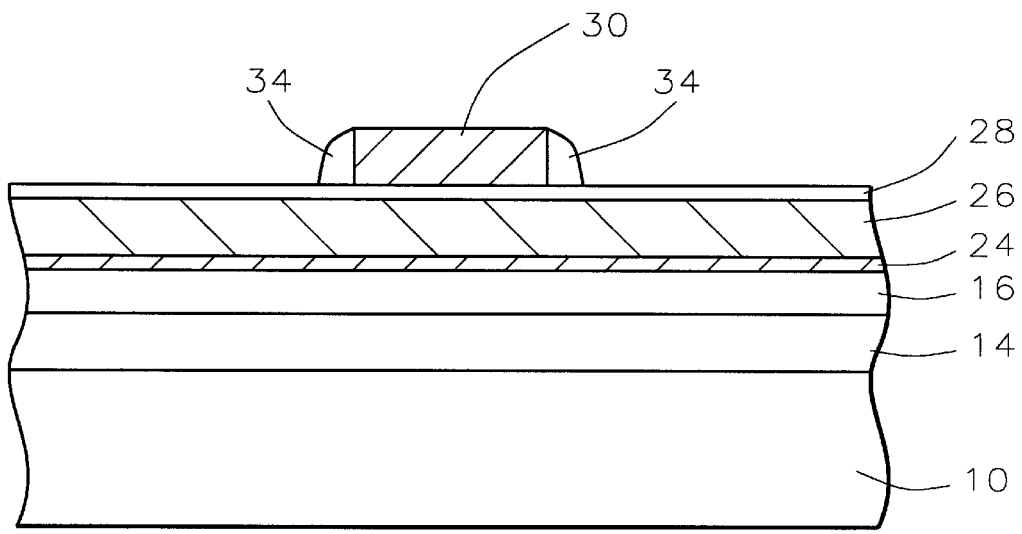

In a key feature of the present invention, a spin-on flowable material 32 is deposited over the capacitor dielectric and top metal electrode, as shown in FIG. 4. This material 32 may be any one of all kinds of oxides, nitrides, polymerics, low dielectric constant dielectrics, or the like. The material 32 may be deposited to a thickness of between about 800 and 1200 Angstroms.

The flowable material 32 is anisotropically blanket etched with good selectivity to metal to leave spacers 34 on the sidewalls of the top metal electrode 30. The thickness of the spacers 34 depends on the thickness of the flowable material 32. Preferably, the spacers will have a thickness of between about 600 and 1000 Angstroms and at least 500 Angstroms.

Figure 6:
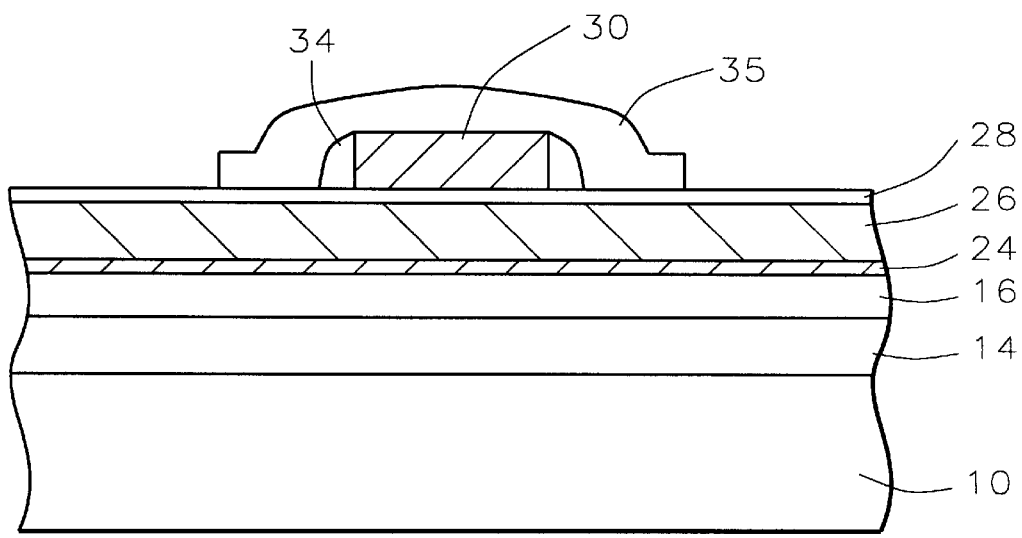

Now, a photoresist layer is coated over the wafer and exposed and developed to form a photoresist mask 35, as shown in FIG. 6. The spacers 34 increase the edge resist thickness and shield the metal corners since a gentle sloping profile is presented to the flowing resist. The spacers provide a gentle slope for better conformal flow of the photoresist material.

Figure 7:
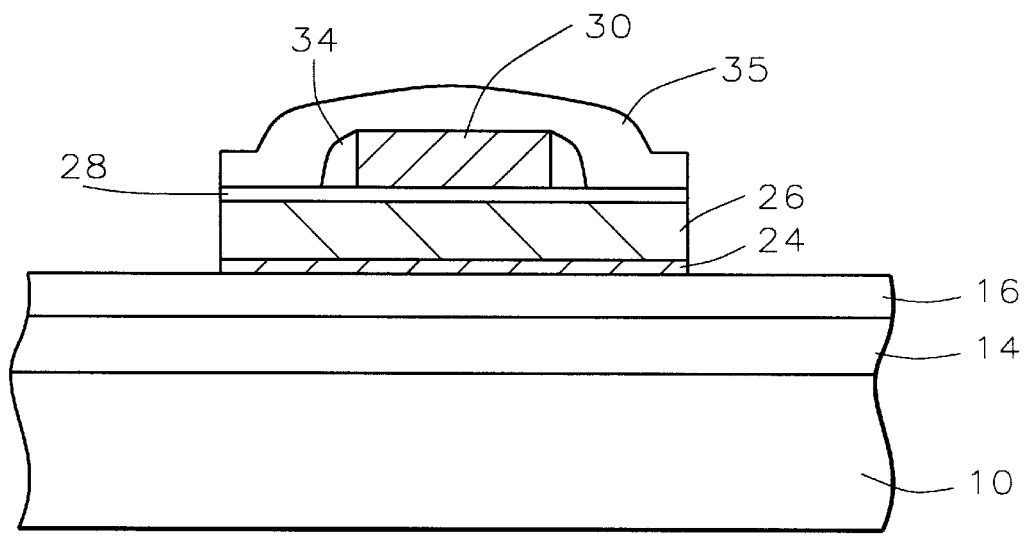

The capacitor dielectric layer 28, bottom metal layer 26, and barrier metal layer 24 are etched away where they are not covered by the mask 35 to form a MIM, as shown in FIG. 7. Because of the spacers 34, the resist mask 35 has extra thickness at the corner regions. Also, the spacers 34 provide additional etching protection to the metal corners. Without the key sidewall spacers of the present invention, top metal corner exposure has been observed. However, with the sidewall spacers of the present invention, the top metal corners are not exposed, resulting in both well-defined top and bottom metal electrodes. This leads to improved MIM capacitor matching capability.

The photoresist mask 35 is removed by plasma ashing, for example. It is not necessary to remove the sidewall spacers 34. An intermetal dielectric layer is typically deposited over the completed MIM capacitor. This may be the same material as the sidewall spacers 34. Even if the material is different, the small amount of spacer material is not a concern.

Figure 8:
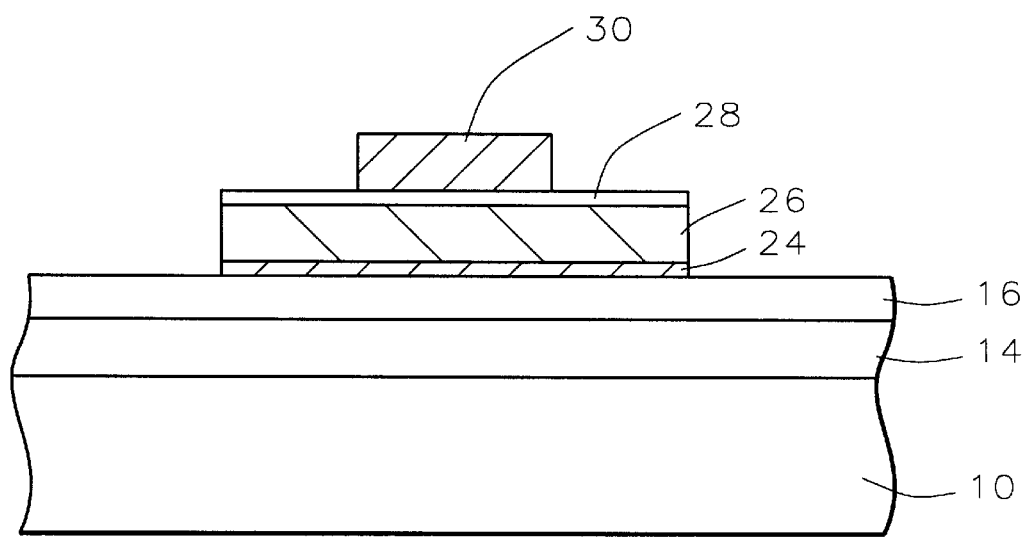

FIG. 8 illustrates the completed MIM capacitor comprising top plate electrode 30, capacitor dielectric 28, and bottom plate electrode 26.

FIGS. 1 through 8 illustrate the method of a preferred embodiment of the present invention. It should be understood that the MIM capacitor of the present invention may be formed at any level within the wafer.

The process of the invention results in the fabrication of a metal-insulator-metal capacitor having well-defined top and bottom electrodes without corner etching or rounding of the top metal electrode. The process of the present invention overcomes the issue of varying capacitor characteristics by preventing the top metal from being exposed and etched away during bottom metal etching. This improves capacitor matching capability which is especially important in RF mixed signal applications.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a metal-insulator-metal capacitor comprising:
providing an insulating layer overlying a semiconductor substrate;
depositing a first metal layer over said insulating layer;
depositing a capacitor dielectric layer overlying said first metal layer;
depositing a second metal layer overlying said capacitor dielectric layer and patterning said second metal layer to form a top metal electrode;
depositing a flowable material layer overlying said capacitor dielectric and said top metal electrode;
anisotropically etching away said flowable material layer to leave said flowable material layer only as spacers on sidewalls of said top metal electrode;
forming a photoresist mask overlying said capacitor dielectric and said top metal electrode wherein said spacers provide extra photoresist thickness at said sidewalls of said top metal layer;
patterning said capacitor dielectric layer and said first metal layer using said photoresist mask wherein patterned said first metal layer forms a bottom metal electrode and wherein said spacers protect said top metal layer from etching during said patterning; and
removing said photoresist mask to complete fabrication of said metal-insulator-metal capacitor.

2. The method according to claim 1 wherein said semiconductor substrate includes gate electrodes and source and drain regions of semiconductor device structures.

3. The method according to claim 1 wherein said semiconductor substrate includes gate electrodes and source and drain regions and multiple levels of metal interconnections of semiconductor device structures.

4. The method according to claim 2 further comprising forming contacts between some of said semiconductor device structures and said first metal layer to form a node contact of said metal-insulator-metal capacitor.

5. The method according to claim 1 wherein said first metal layer comprises one of the group containing aluminum, aluminum-copper, copper, tungsten, and alloys.

6. The method according to claim 1 further comprising depositing a barrier metal layer underlying said first metal layer wherein said barrier metal layer has a thickness of between about 300 and 600 Angstroms.

7. The method according to claim 1 wherein said capacitor dielectric comprises one of the group containing: silicon nitride, tantalum, tantalum nitride, and tantalum/tantalum nitride.

8. The method according to claim 1 wherein said second metal layer comprises one of the group containing aluminum, aluminum-copper, copper, tungsten, and alloys.

9. The method according to claim 1 wherein said flowable material comprises one of the group containing oxides, nitrides, polymerics, and low dielectric constant dielectrics.

10. The method according to claim 1 wherein said spacers have a thickness of between about 600 and 1000 Angstroms.

11. A method for fabricating a metal-insulator-metal capacitor comprising:
providing an insulating layer overlying a semiconductor substrate;
depositing a first metal layer over said insulating layer;
depositing a capacitor dielectric layer overlying said first metal layer;
depositing a second metal layer overlying said capacitor dielectric layer and patterning said second metal layer to form a top metal electrode;
depositing a flowable material layer overlying said capacitor dielectric and said top metal electrode;
anisotropically etching away said flowable material layer to leave said flowable material layer only as spacers on sidewalls of said top metal electrode wherein said spacers have a thickness of at least 500 Angstroms;

forming a photoresist mask overlying said capacitor dielectric and said top metal electrode wherein said spacers provide extra photoresist thickness at said sidewalls of said top metal layer;

patterning said capacitor dielectric layer and said first metal layer using said photoresist mask wherein patterned said first metal layer forms a bottom metal electrode and wherein said spacers protect said top metal layer from etching during said patterning; and removing said photoresist mask to complete fabrication of said metal-insulator-metal capacitor.

12. The method according to claim 11 wherein said semiconductor substrate includes gate electrodes and source and drain regions of semiconductor device structures.

13. The method according to claim 11 wherein said semiconductor substrate includes gate electrodes and source and drain regions and multiple levels of metal interconnections of semiconductor device structures.

14. The method according to claim 12 further comprising forming contacts between some of said semiconductor device structures and said first metal layer to form a node contact of said metal-insulator-metal capacitor.

15. The method according to claim 11 wherein said first metal layer comprises one of the group containing aluminum, aluminum-copper, copper, tungsten, and alloys.

16. The method according to claim 11 further comprising depositing a barrier metal layer underlying said first metal layer wherein said barrier metal layer has a thickness of between about 300 and 600 Angstroms.

17. The method according to claim 11 wherein said capacitor dielectric comprises one of the group containing silicon nitride, tantalum, tantalum nitride, and tantalum/tantalum nitride.

18. The method according to claim 11 wherein said second metal layer comprises one of the group containing aluminum, aluminum-copper, copper, tungsten, and alloys.

19. The method according to claim 11 wherein said flowable material comprises one of the group containing oxides, nitrides, polymerics, and low dielectric constant dielectrics.

20. The method according to claim 11 wherein said spacers have a thickness of between about 600 and 1000 Angstroms.

21. A method for fabricating a metal-insulator-metal capacitor comprising:

providing an insulating layer overlying a semiconductor substrate;

depositing a barrier metal layer over said insulating layer;

depositing a first metal layer over said barrier metal layer;

depositing a capacitor dielectric layer overlying said first metal layer;

depositing a second metal layer overlying said capacitor dielectric layer and patterning said second metal layer to form a top metal electrode;

depositing a flowable material layer overlying said capacitor dielectric and said top metal electrode;

anisotropically etching away said flowable material layer to leave said flowable material layer only as spacers on sidewalls of said top metal electrode wherein said spacers have a thickness of at least 500 Angstroms;

forming a photoresist mask overlying said capacitor dielectric and said top metal electrode wherein said spacers provide extra photoresist thickness at said sidewalls of said top metal layer;

patterning said capacitor dielectric layer and said first metal layer using said photoresist mask wherein patterned said first metal layer forms a bottom metal electrode and wherein said spacers protect said top metal layer from etching during said patterning; and removing said photoresist mask to complete fabrication of said metal-insulator-metal capacitor.

22. The method according to claim 21 wherein said semiconductor substrate includes gate electrodes and source and drain regions of semiconductor device structures.

23. The method according to claim 21 wherein said first metal layer comprises one of the group containing aluminum, aluminum-copper, copper, tungsten, and alloys.

24. The method according to claim 21 wherein said capacitor dielectric comprises one of the group containing silicon nitride, tantalum, tantalum nitride, and tantalum/tantalum nitride.

25. The method according to claim 21 wherein said second metal layer comprises one of the group containing aluminum, aluminum-copper, copper, tungsten, and alloys.

26. The method according to claim 21 wherein said flowable material comprises one of the group containing oxides, nitrides, polymerics, and low dielectric constant dielectrics.

27. The method according to claim 21 wherein said spacers have a thickness of between about 600 and 1000 Angstroms.

* * * * *